(12) United States Patent
Abdo

(10) Patent No.: US 9,966,926 B2
(45) Date of Patent: May 8, 2018

(54) LOSSLESS MICROWAVE SWITCH BASED ON TUNABLE FILTERS FOR QUANTUM INFORMATION PROCESSING

(71) Applicant: INTERNATIONAL BUSINESS MACHINES CORPORATION, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/289,687

(22) Filed: Oct. 10, 2016

(65) Prior Publication Data

US 2018/0091115 A1    Mar. 29, 2018

Related U.S. Application Data

(63) Continuation of application No. 15/275,510, filed on Sep. 26, 2016.

(51) Int. Cl.
| | | |
|---|---|---|
| *H01P 1/10* | (2006.01) | |
| *H03H 7/46* | (2006.01) | |
| *H03H 7/01* | (2006.01) | |

(52) U.S. Cl.
CPC ............ *H03H 7/46* (2013.01); *H03H 7/0138* (2013.01)

(58) Field of Classification Search
CPC .......... H03H 7/38; H03H 7/0138; H03H 7/40; H03H 7/46
USPC ................................. 333/101, 262, 263, 258
See application file for complete search history.

(56) References Cited

U.S. PATENT DOCUMENTS

| | | |
|---|---|---|
| 2004/0230814 A1 | 11/2004 | Lundvall et al. |
| 2008/0197947 A1 | 8/2008 | Gevorgyan et al. |
| 2010/0205233 A1 | 8/2010 | Morgan |
| 2012/0306590 A1 | 12/2012 | Rhodes |
| 2016/0043701 A1 | 2/2016 | Morgan |
| 2017/0104695 A1* | 4/2017 | Naaman .................. H04L 49/40 |

OTHER PUBLICATIONS

Baleegh Abdo., "Lossless Microwave Switch Based on Tunable Filters for Quantum Information Processing", U.S. Appl. No. 15/275,510, filed Sep. 26, 2016.
List of IBM Patents or Patent Applications Treated as Related; (Appendix P), Filed Feb. 8, 2017, 2016; 2 pages.
PCT/IB2017/054694 International Search Report and Written Opinion, dated Nov. 22, 2017.
PCT/EP/2017074478 International Search Report and Written Opinion, dated Jan. 18, 2018.
A. Menezes et al., "Handbook of Applied Cryptography", Chapter 9, Hash Functions and Data Integrity, Jan. 1, 1997, CRC Press, pp. 321-383.
Morris J. Dworkin, "SHA-3 Standard: Permutation-Based Hash and Extendable-Output Functions", National Institute of Standards and Technology, Jul. 1, 2015,XP055433979, Retrieved from the Internet: http://nvlpubls.nist.gov/nistpubs/FIPS.202.pdf.

\* cited by examiner

*Primary Examiner* — Robert J Pascal
*Assistant Examiner* — Kimberly Glenn
(74) *Attorney, Agent, or Firm* — Cantor Colburn LLP; Vazken Alexanian

(57) ABSTRACT

A technique relates to a lossless microwave switch discussed herein. Multiple ports are included in the lossless microwave switch. Tunable filters are included in the lossless microwave switch. Each of the ports is operatively coupled a corresponding one of the tunable filters.

19 Claims, 13 Drawing Sheets

PROVIDE A PLURALITY OF PORTS 1105

CONNECT TUNABLE FILTERS, WHEREIN EACH OF THE PLURALITY OF PORTS IS ASSOCIATED WITH ONE OF THE TUNABLE FILTERS, WHEREIN EACH OF THE TUNABLE FILTERS INCLUDES A SUPERCONDUCTING QUANTUM INTERFERENCE DEVICE 1110

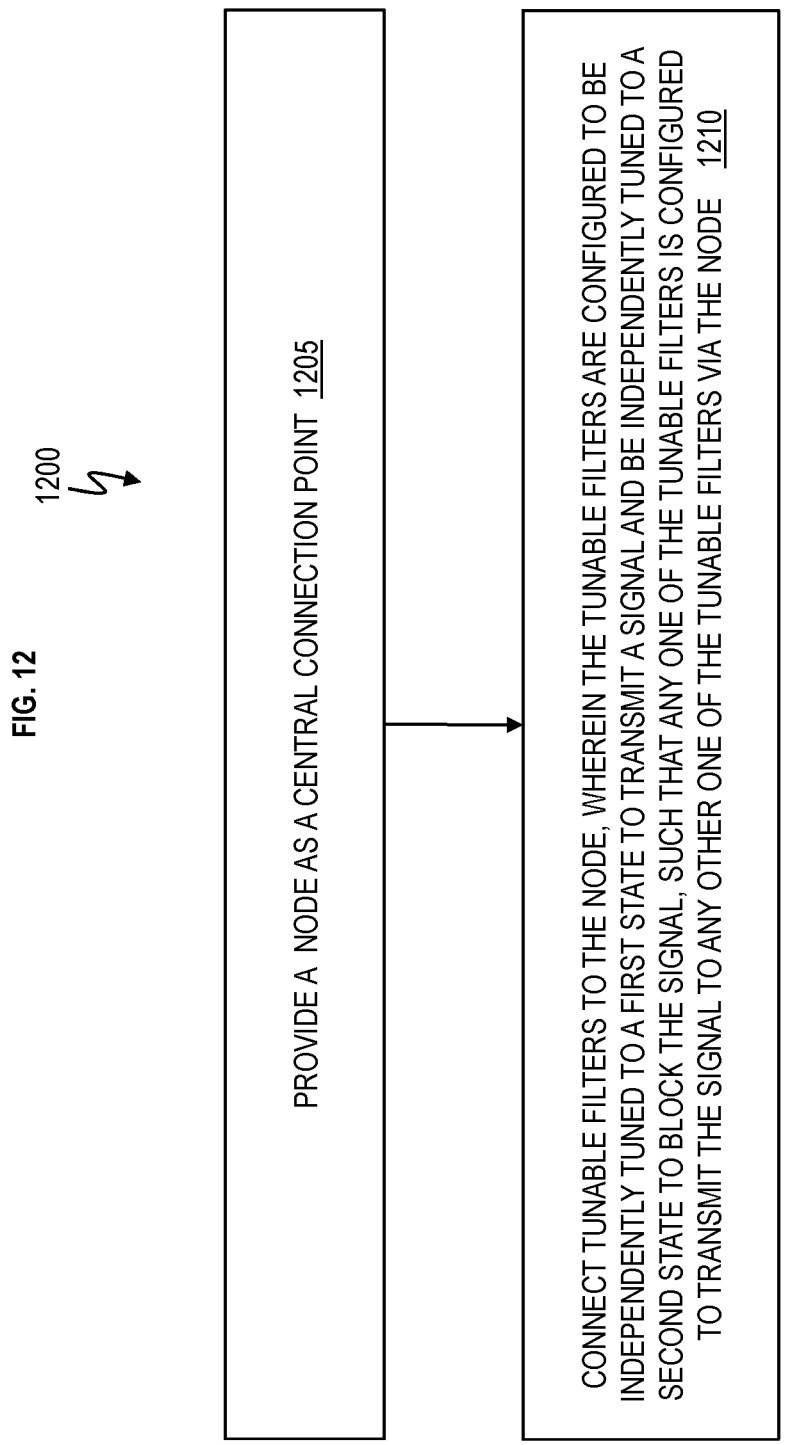

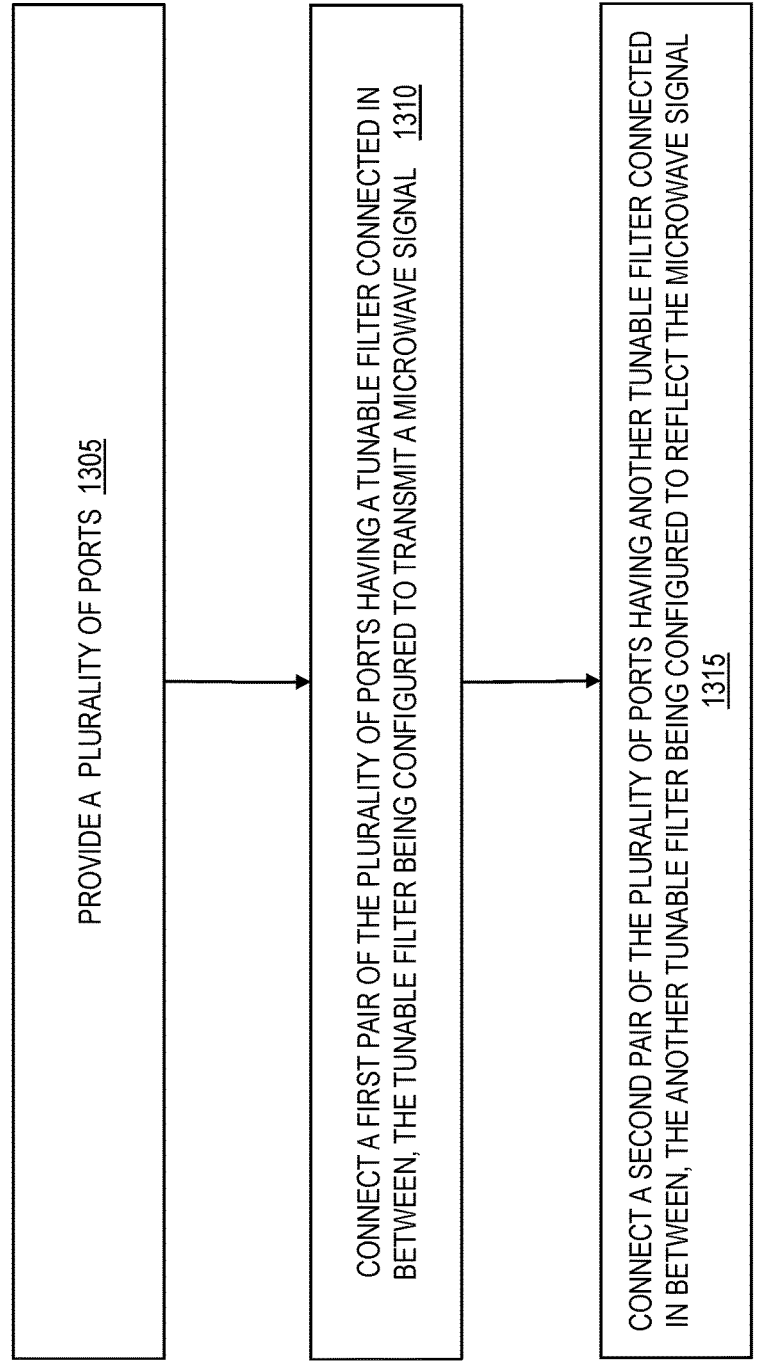

LOSSLESS MICROWAVE SWITCH BASED ON TUNABLE FILTERS FOR QUANTUM INFORMATION PROCESSING

This application is a continuation of U.S. Non-Provisional application Ser. No. 15/275,510, entitled "LOSSLESS MICROWAVE SWITCH BASED ON TUNABLE FILTERS FOR QUANTUM INFORMATION PROCESSING", filed Sep. 26, 2016, which is incorporated herein by reference in its entirety.

BACKGROUND

The present invention relates to superconducting electronic devices, and more specifically, lossless microwave switches and/or routers based on tunable filters for quantum information processing.

A radio frequency (RF) and microwave switch is a device to route high frequency signals through transmission paths. RF and microwave switches are used extensively in microwave test systems for signal routing between instruments and devices. Incorporating a switch into a switch matrix system enables one to route signals from multiple instruments to single or multiple devices. Similar to electrical switches, RF and microwave switches come in different configurations providing the flexibility to create complex matrixes and automated test systems for many different applications.

In physics and computer science, quantum information is information that is held in the state of a quantum system. Quantum information is the basic entity of study in quantum information theory, and can be manipulated using engineering techniques known as quantum information processing. Much like classical information can be processed with digital computers, transmitted from place to place, manipulated with algorithms, and analyzed with the mathematics of computer science, analogous concepts apply to quantum information. Quantum systems such as superconducting qubits are very sensitive to electromagnetic noise, in particular in the microwave and infrared domains.

SUMMARY

According to one or more embodiments, a lossless microwave switch is provided. The lossless microwave switch includes a plurality of ports and tunable filters. Each of the plurality of ports is operatively coupled to a corresponding one of the tunable filters.

According to one or more embodiments, a method of configuring a lossless microwave switch is provided. The method includes providing a plurality of ports and providing tunable filters. Each of the plurality of ports is operatively coupled to a corresponding one of the tunable filters.

According to one or more embodiments, a lossless microwave switch is provided. The lossless microwave switch includes a plurality of ports and tunable filters. Each of the plurality of ports is associated with one of the tunable filters. Each of the tunable filters includes a superconducting quantum interference device.

According to one or more embodiments, a lossless microwave switch is provided. The lossless microwave switch includes a node and tunable filters connected to the node. The tunable filters are configured to be independently tuned to a first state to transmit a signal and be independently tuned to a second state to block the signal, such that any one of the tunable filters is configured to transmit the signal to any other one of the tunable filters via the node.

According to one or more embodiments, a lossless microwave switch is provided. The lossless microwave switch includes a plurality of ports. A first pair of the plurality of ports has a tunable filter connected in between, in which the tunable filter is configured to transmit a microwave signal. A second pair of the plurality of ports has another tunable filter connected in between, in which the other tunable filter is configured to reflect the microwave signal.

BRIEF DESCRIPTION OF THE DRAWINGS

FIG. 11 is a flow chart of a method for configuring a superconducting microwave switch/router according to one or more embodiments.

FIG. 12 is a flow chart of a method of configuring a superconducting microwave switch/router according to one or more embodiments.

FIG. 13 is a flow chart of a method of configuring a superconducting microwave switch/router according to one or more embodiments.

DETAILED DESCRIPTION

Figure 1:
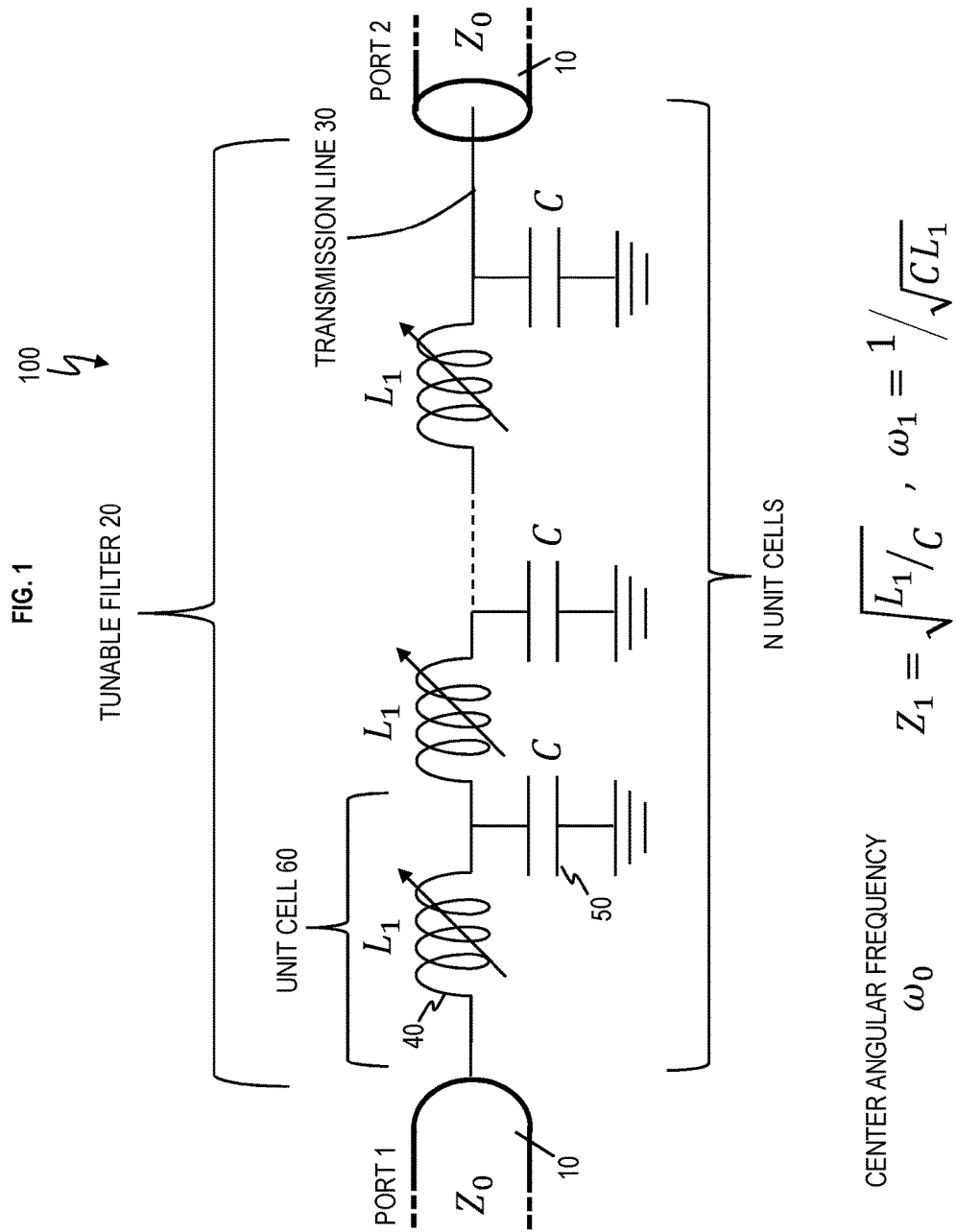
FIG. 1 is a schematic of a superconducting microwave switch/router according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

In accordance with one or more embodiments, superconducting (or lossless) microwave switches/routers allow one to route quantum signals on demand between different nodes of a circuit or between different ports. Superconducting microwave switches can have many applications in the area of quantum information processing. For example, superconducting microwave switches can be utilized for time-multiplexed readout, time-multiplexed driving (e.g., cross-resonance drives), time-multiplexed characterization of several devices, time-multiplexed interaction between pairs of quantum systems, time-dependent circulation of signals, etc.

According to one or more embodiments, a superconducting microwave switch that can have one input port and N output ports is provided. Also, the superconducting microwave switch can have one output port and N input ports. Each of the ports of the superconducting microwave device is designed to have the same characteristic impedance $Z_0$. In one implementation, each input-output pair is connected through a tunable low-pass filter whose cutoff frequency can be tuned in-situ using applied magnetic flux. The tunable low-pass filter can be implemented using a ladder of series inductive elements (e.g., direct current (DC) superconducting quantum interference devices (SQUIDs)) and shunt capacitive elements (e.g., lumped-element capacitors). In another implementation, each input-output pair can be connected through a tunable high-pass filter whose cutoff frequency can be tuned in-situ using applied magnetic flux, and the tunable high-pass filter can be implemented using series capacitive elements (e.g., lumped-element capacitors) and shunt inductive elements (e.g., DC-SQUIDs).

Now turning to the figures, FIG. 1 is a schematic of a superconducting microwave switch/router 100 according to one or more embodiments. FIG. 1 illustrates building blocks of the superconducting microwave switch/router 100 based on a tunable filter 20. In this example, the tunable filter 20 is a tunable low-pass filter (TLPF). However, it should be appreciated that embodiments are not limited to low-pass filters as discussed further below.

In this example, the microwave switch/router 100 includes ports 10, such as for example, ports 1 and 2. The ports 10 are input and output ports. The tunable filter 20 includes one or more unit cells 60. Each unit cell 60 includes a variable inductor 40 designated as variable inductive element $L_1$ (and other examples include L2, L3, and DC-SQUIDs discussed further below), and each unit cell 60 includes a capacitor 50 designated as capacitive element C. In each unit cell 60, the variable inductor $L_1$ 40 is connected in series with ports 10, and a capacitor C 50 is connected to one end of the variable inductor 40 and to ground. There can be N number of unit cells 60 repeated and connected together (in series) in the tunable filter 20 for a total of N unit cells. For N unit cells, the inductors L1 40 are connected in series, with each inductor L1 40 shunted to ground by its respective capacitor 50. The interconnection of the ports 10, variable inductors L1 40, and capacitors C 50 is by transmission line 30. The transmission line 30 acts as a superconducting wire or waveguide to carry a microwave signal from port 1 via the tunable filter 20 to port 2, or vice versa. A coaxial cable can connect to the external ends of the ports 10 such that one coaxial cable inputs microwave signals and another coaxial cable outputs the microwave signals. The transmission line 30 can be a stripline, microstrip, etc. The variable inductors 40, capacitors 50, and transmission lines 30 are made of superconducting material. Examples of superconducting materials (at low temperatures, such as about 10-100 millikelvin (mK), or about 4 K) include niobium, aluminum, tantalum, etc.

Figure 2:
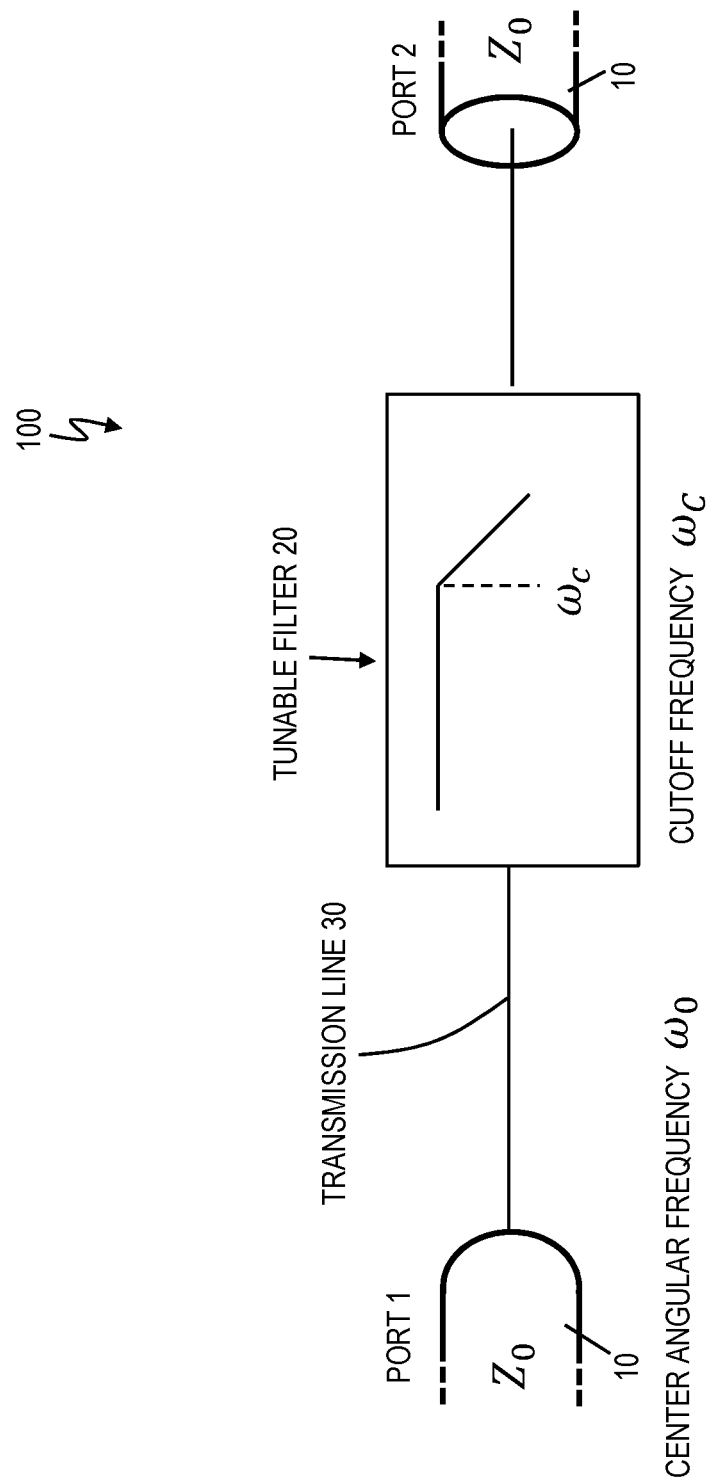
FIG. 2 is a block diagram of the superconducting microwave switch/router in FIG. 1 according to one or more embodiments.

FIG. 2 is a block diagram of the superconducting microwave switch/router 100 in FIG. 1 according to one or more embodiments. FIG. 2 is an equivalent circuit to FIG. 1 without depicting the internal details of the tunable filter 20.

It can be assumed that the microwave signal that is to be transmitted through the superconducting microwave switch/router 100 has a center angular frequency $\omega_0$. The impedance designation $Z_0$ is the characteristic impedance at ports 1 and 2 (which can be the input and output ports or vice versa). For example, the characteristic impedance $Z_0$ can be 50 ohms ($\Omega$) at each port.

For an individual unit cell 60, the impedance is $Z_1$ where $$Z_1 = \sqrt{\frac{L_1}{C}}$$

and where the angular frequency $\omega_1$ of the unit cell 60 is $$\omega_1 = \frac{1}{\sqrt{CL_1}}.$$

The cutoff angular frequency of the tunable filter 20 denoted as $\omega_C$ is on the order of the angular resonance frequency $\omega_1$ of the unit cell 60 (or multiple unit cells added together) and it is correlated with $\omega_1$, meaning $\omega_C$ increases and decreases with $\omega_1$. The exact dependence of $\omega_C$ on $\omega_1$ and on the number of unit cells N can be found through a microwave simulation or calculation. From this it follows that the cutoff frequency $\omega_C$ of the tunable filter 20 depends on the values of the variable inductor $L_1$ 40 and the capacitor C 50 (for the one or more unit cells 60). In particular, the inductance of the variable inductor $L_1$ 40 controls the cutoff frequency $\omega_C$ of the tunable filter 20, thereby controlling when the tunable filter 20 is operating in transmission or reflection with respect to the microwave signal (center angular frequency $\omega_0$). The inductance of the variable inductors $L_1$ 40 has an inverse relationship to the cutoff frequency $\omega_C$. For example, when the inductance of the variable inductor $L_1$ 40 is increased, the cutoff frequency $\omega_C$ of the tunable filter 20 is decreased. Conversely, when the inductance of the variable inductor $L_1$ 40 is decreased, the cutoff frequency $\omega_C$ of the tunable filter 20 is increased. It is noted that varying the inductance of the unit cells does not only change the cutoff frequency of the filter but also changes its characteristic impedance. Therefore, it can be desirable that $Z_1$ or the characteristic impedance of the filter matches the characteristic impedance of the ports as much as possible when the switch is closed, i.e., operated in the transmission mode.

Accordingly, when operating as a closed switch, the superconducting microwave switch/router 100 is controlled to pass the microwave signal (center angular frequency $\omega_0$) in transmission from port 1 to port 2 (or vice versa) by decreasing the inductance of the variable inductor $L_1$ 40 in the tunable filter 20. This allows the microwave signal (center angular frequency $\omega_0$) to fall within the low-pass band of the tunable filter 20. When operating as an open switch, the superconducting microwave switch/router 100 is controlled to block transmission of the microwave signal (center angular frequency $\omega_0$) from port 1 to port 2 (or vice versa) using reflection by increasing the inductance of the variable inductor $L_1$ 40 in the tunable filter 20. This allows the microwave signal (center angular frequency $\omega_0$) to fall outside of the low-pass band and thus be attenuated or in other words reflected.

Figure 3:
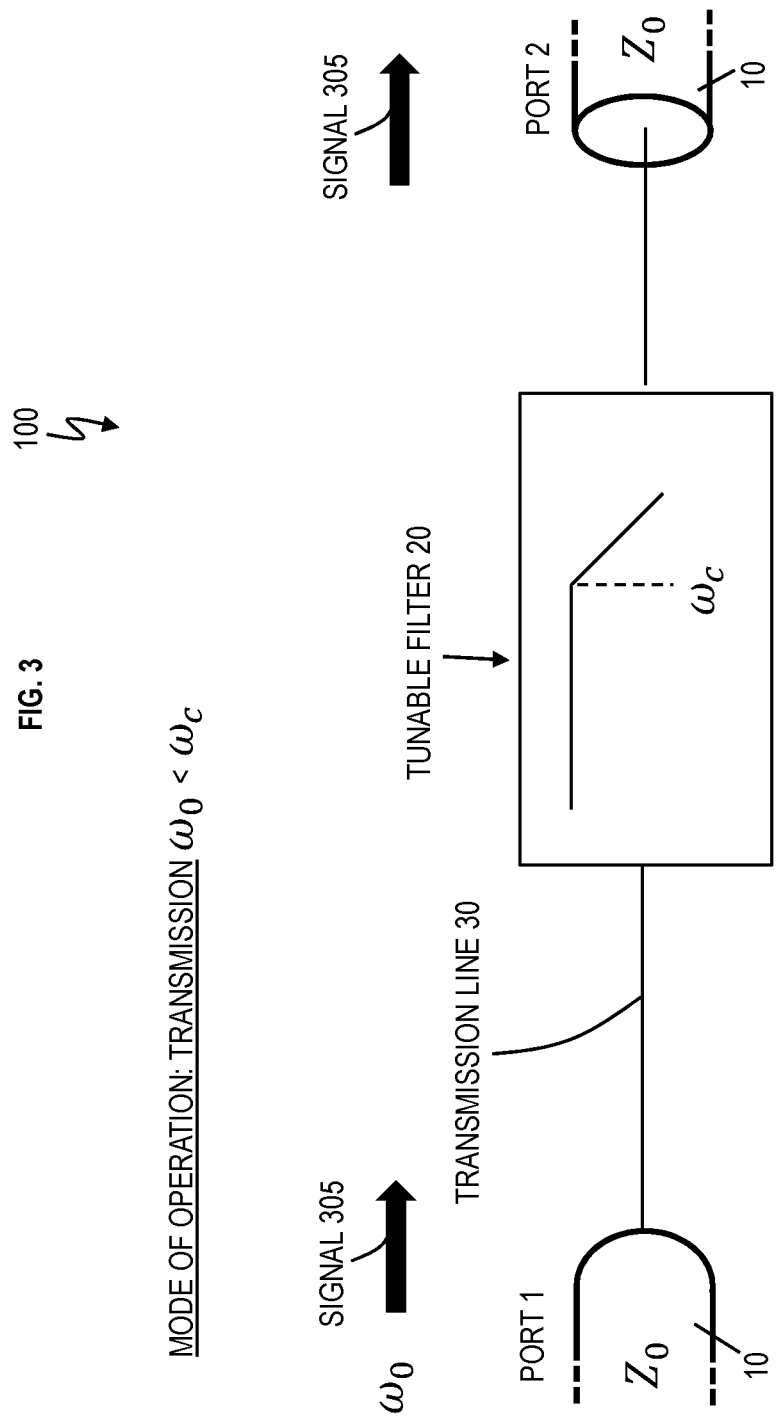
FIG. 3 is a schematic of the superconducting microwave switch/router illustrating transmission as the mode of operation according to one or more embodiments.

FIG. 3 is a schematic of the superconducting microwave switch/router 100 illustrating transmission as the mode of operation according to one or more embodiments. In FIG. 3, the tunable filter 20 is tuned such that the center angular frequency $\omega_0$ of the incoming microwave signal 305 through the device port is less than the cutoff frequency $\omega_C$ of the tunable filter 20, i.e., $\omega_0 < \omega_C$. In this mode of operation, the tunable filter 20 is configured to operate in transmission because the frequency of the microwave signal 305 is less than the cutoff frequency of the tunable low-pass filter 20. Under this condition, the microwave signal 305 is transmitted from port 1 through the tunable filter 20 to port 2, such that the microwave signal 305 is output as desired.

Figure 4:
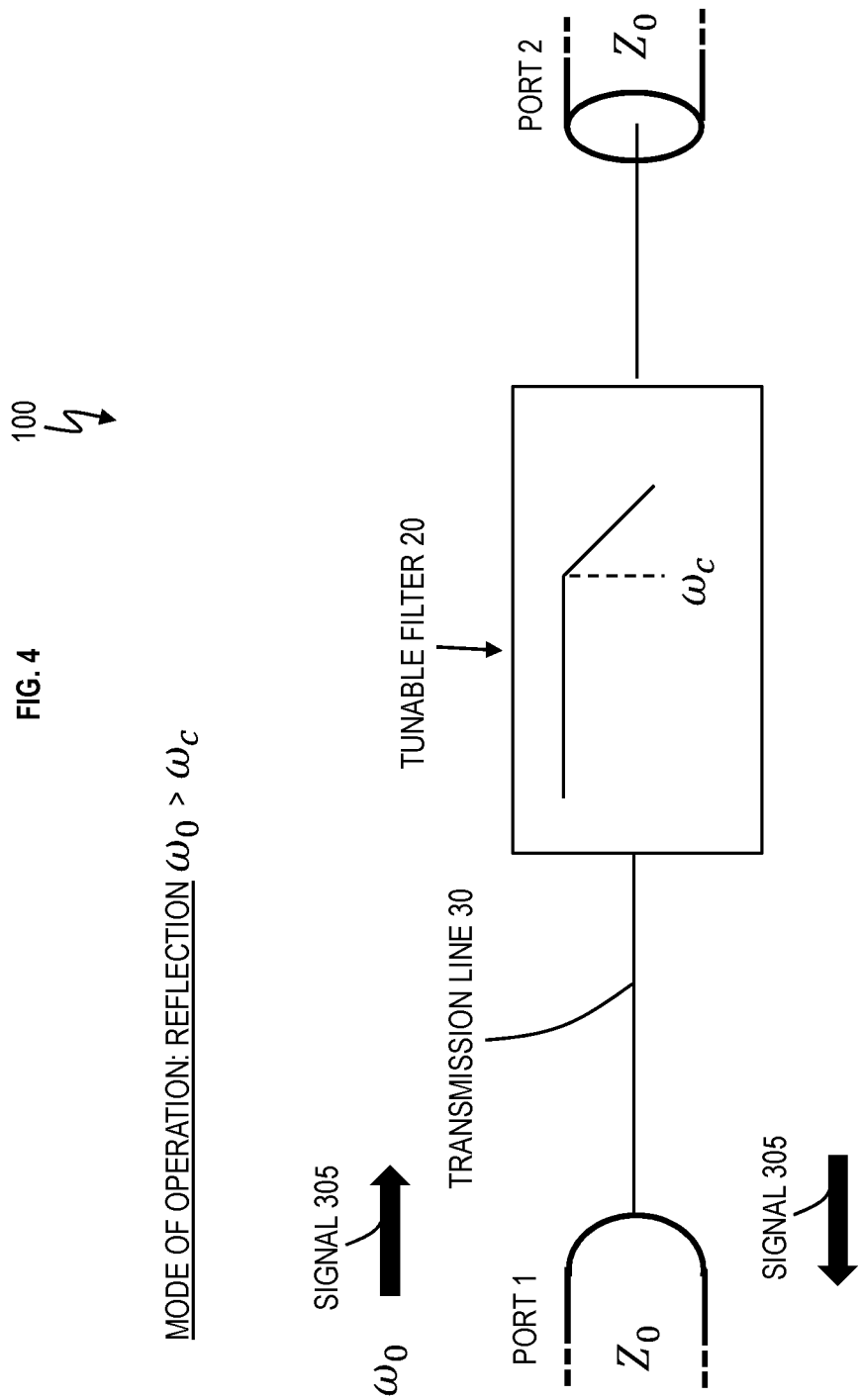
FIG. 4 is a schematic of the superconducting microwave switch/router illustrating reflection as the mode of operation according to one or more embodiments.

FIG. 4 is a schematic of the superconducting microwave switch/router 100 illustrating reflection as the mode of operation according to one or more embodiments. In FIG. 4, the tunable filter 20 is tuned such that the center angular frequency $\omega_0$ of the microwave signal 305 is greater than the cutoff frequency $\omega_C$ of the tunable filter 20, i.e., $\omega_0 > \omega_C$. In this mode of operation, the tunable filter 20 is configured to operate in reflection because the frequency of the microwave signal 305 is greater than the cutoff frequency of the tunable low-pass filter 20. Under this condition, when the microwave signal 305 enters through port 1, the microwave signal 305 is blocked from passing to port 2 because the tunable filter 20 reflects the microwave signal 305, thereby not allowing the microwave signal 305 to pass from port 1 to port 2.

Figure 5:
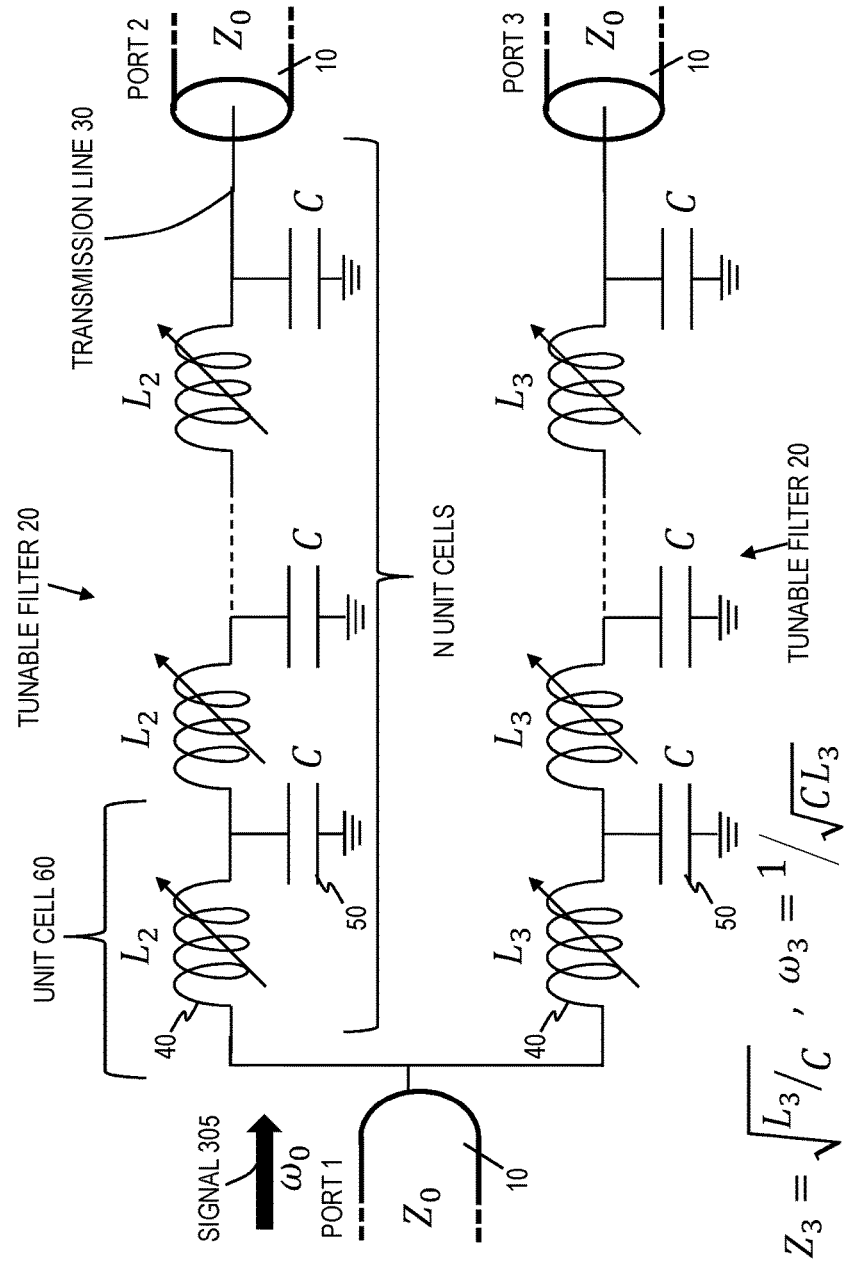
FIG. 5 is a schematic of a superconducting microwave switch/router according to one or more embodiments.
Figure 6:
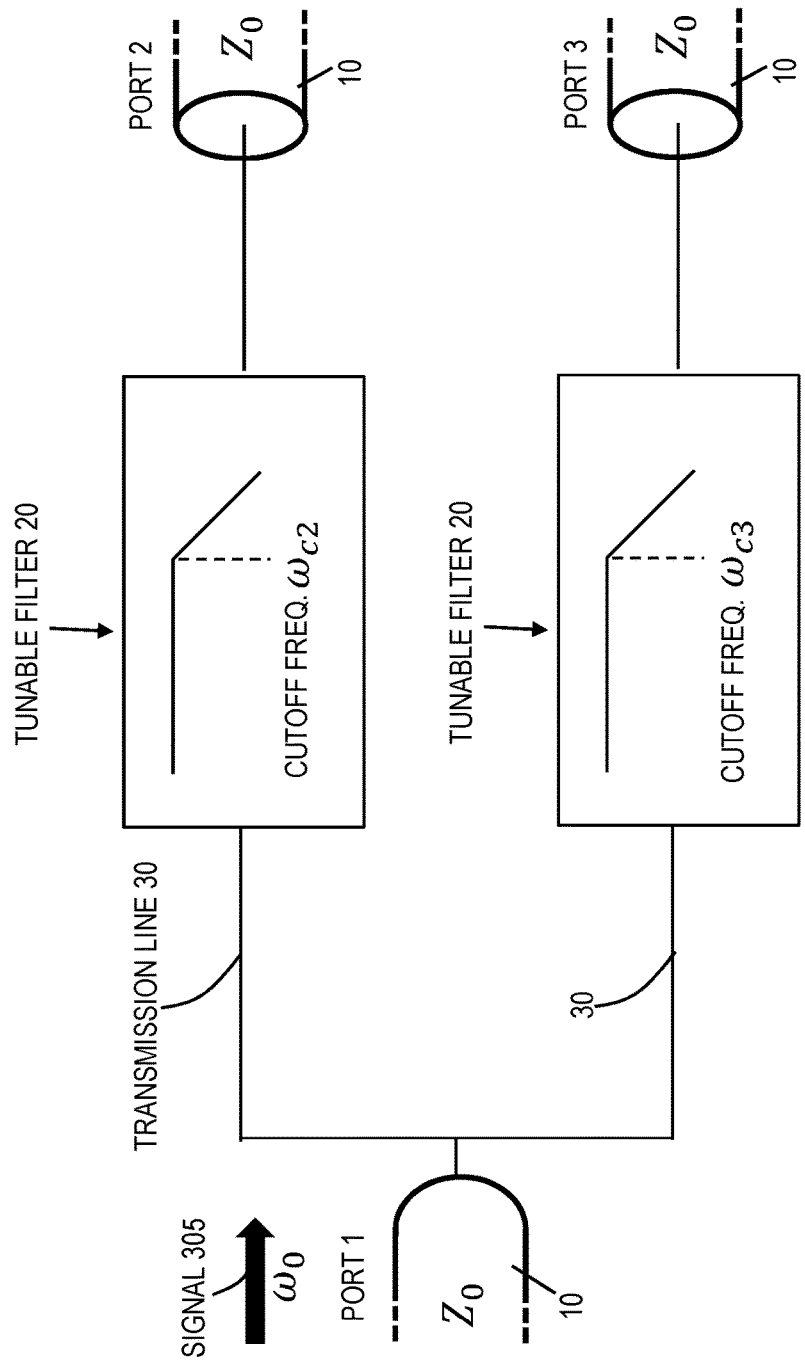
FIG. 6 is a block diagram of the superconducting microwave switch/router in FIG. 5 according to one or more embodiments.

FIG. 5 is a schematic of a superconducting microwave switch/router 100 according to one or more embodiments. FIG. 6 is a block diagram of the superconducting microwave switch/router 100 in FIG. 5 according to one or more embodiments. FIG. 6 is an equivalent circuit to FIG. 5 without depicting the internal details of the tunable filter 20. FIGS. 5 and 6 are analogous to FIGS. 1 and 2, except that FIGS. 5 and 6 have been extended to 3 ports instead of 2 ports. It is understood that the superconducting microwave switch/router 100 can be extended to N number of ports as desired according to embodiments.

In the configuration depicted in FIGS. 5 and 6, there are two tunable filters 20. One tunable filter 20 is connected between port 1 and port 2, while the other tunable filter 20 is connected between port 1 and port 3. Each of the tunable filters 20 is formed of one or more unit cells 60 as discussed above. For explanation purposes, the one or more variable inductors 40 are identified as $L_2$ in the tunable filter 20 connected between ports 1 and 2, while the one or more variable inductors 40 are identified as $L_3$ in the tunable filter 20 connected between ports 1 and 3. The tunable filters 20 between ports 1 and 2 and ports 1 and 3, respectively, are individually controlled such that one can be in transmission while the other is operating in reflection.

The tunable filter 20 between ports 1 and 2 includes one or more unit cells 60. Each unit cell 60 includes a variable inductor $L_2$ 40 and capacitor 50. In each unit cell 60, the variable inductor $L_2$ 40 is connected in series with ports 1 and 2, and the capacitor C 50 is connected to one end of the variable inductor 40 and to ground. There can be N number of unit cells 60 repeated and connected together in the tunable filter 20 for a total of N unit cells between ports 1 and 2. For the tunable filter 20 between ports 1 and 2, the impedance of each unit cell is $Z_2$ where $$Z_2 = \sqrt{\frac{L_2}{C}}$$

and the angular frequency is $\omega_2$ where $$\omega_2 = \frac{1}{\sqrt{CL_2}}.$$

Similarly, the tunable filter 20 connected between ports 1 and 3 includes one or more unit cells 60. Each unit cell 60 includes a variable inductor $L_3$ 40 and capacitor 50. In each unit cell 60, the variable inductor $L_3$ 40 is connected in series with ports 1 and 3, and the capacitor C 50 is connected to one end of the variable inductor $L_3$ 40 and to ground. There can be N number of unit cells 60 repeated and connected together in the tunable filter 20 for a total of N unit cells between ports 1 and 3. For the tunable filter 20 connected between ports 1 and 3, the impedance of each unit cell is $Z_3$ where $$Z_3 = \sqrt{\frac{L_3}{C}}$$

and the angular frequency is $\omega_3$ where $$\omega_3 = \frac{1}{\sqrt{CL_3}}.$$

It should be appreciated that additional ports and tunable filters can be analogously added as desired.

In FIG. 2, the cutoff frequency of the single tunable filter 20 was designated as $\omega_C$ above. Because more than one tunable filter 20 is provided in FIGS. 5 and 6, the tunable filter 20 connected between ports 1 and 2 is designated as cutoff frequency $\omega_{C2}$ while the tunable filter 20 connected between ports 1 and 3 is designated as cutoff frequency $\omega_{C3}$.

For operation of the microwave signal 305 in transmission from/between port 1 to port 2 (or vice versa), the tunable filter 20 between ports 1 and 2 is tuned such that the center angular frequency $\omega_0$ of the microwave signal 305 is less than the cutoff frequency $\omega_{C2}$ of the tunable filter 20 between ports 1 and 2, while the tunable filter 20 between ports 1 and 3 is tuned such that the center angular frequency $\omega_0$ of the microwave signal 305 is much greater than the cutoff frequency $\omega_{C3}$ between ports 1 and 3: $\omega_{C3} \ll \omega_0 < \omega_{C2}$. In this mode of operation, the tunable filter 20 between ports 1 and 2 is configured to operate in transmission because the microwave signal 305 ($\omega_0$) is less than the cutoff frequency $\omega_{C2}$, and therefore, the microwave signal 305 is transmitted from port 1 through the tunable filter 20 to port 2, such that the microwave signal 305 is output as desired. Concurrently, the tunable filter 20 connected between ports 1 and 3 is configured to operate in reflection because the microwave signal 305 ($\omega_0$) is greater than the cutoff frequency ($\omega_{C3}$), and therefore, the microwave signal 305 is blocked from passing between ports 1 and 3. Additional conditions for transmission from port 1 to port 2 (or vice versa) include $Z_2 \cong Z_0$ for impedance matching. Additional conditions for reflection from/between ports 1 and 3 include $Z_3 \gg Z_0$.

On the other hand, for operation of the microwave signal 305 in transmission from/between port 1 to port 3 (or vice versa), the tunable filter 20 between ports 1 and 3 is tuned such that the center angular frequency $\omega_0$ of the microwave signal 305 is less than the cutoff frequency $\omega_{C3}$ of the tunable filter 20 between ports 1 and 3, while the tunable filter 20 between ports 1 and 2 is tuned such that the center angular frequency $\omega_0$ of the microwave signal 305 is much greater than the cutoff frequency $\omega_{C2}$ between ports 1 and 2: $\omega_{C2} \ll \omega_0 < \omega_{C3}$. In this mode of operation, the tunable filter 20 between ports 1 and 3 is configured to operate in transmission because the microwave signal 305 ($\omega_0$) is less than the cutoff frequency $\omega_{C3}$, and therefore, the microwave signal 305 is transmitted from port 1 through the tunable filter 20 to port 3, such that the microwave signal 305 is output as desired. Concurrently, the tunable filter 20 connected between ports 1 and 2 is configured to operate in reflection because the microwave signal 305 ($\omega_0$) is greater than the cutoff frequency ($\omega_{C2}$), and therefore, the microwave signal 305 is blocked from passing between ports 1 and 2 in this example. Additional conditions for transmission from port 1 to port 3 (or vice versa) include $Z_3 \cong Z_0$ for impedance matching. Additional conditions for reflection from/between ports 1 and 2 include $Z_2 \gg Z_0$.

Figure 7:
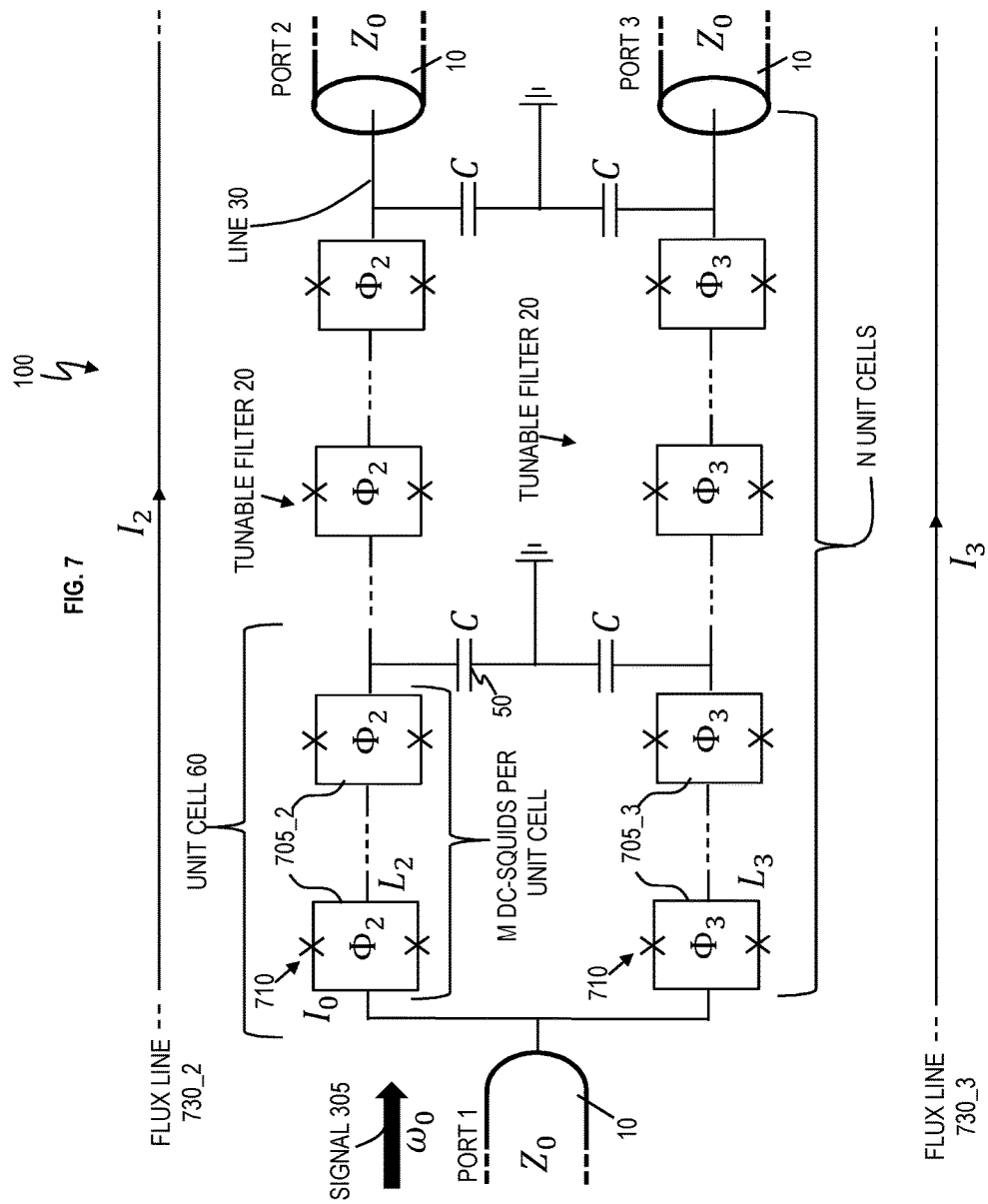
FIG. 7 is a schematic of a superconducting microwave switch/router according to one or more embodiments.

FIG. 7 is a schematic of a superconducting microwave switch/router 100 according to one or more embodiments. FIG. 7 is analogous to FIGS. 5 and 6, except that FIG. 7 implements the lossless/superconducting microwave switch/router 100 utilizing direct current (DC) superconducting quantum interference devices (SQUIDs). In FIG. 7, each of the variable inductors 40 (discussed above) is implemented as (variable) DC-SQUIDs 705 in the tunable filter 20. It is noted that the tunable filters 20 in FIG. 7 are configured to operate in transmission and reflection with respect to each of the tunable filters 20 as discussed above. Also, it is understood that the superconducting microwave switch/router 100 can be extended to N number of ports as desired according to embodiments.

In the configuration depicted in FIG. 7, there are two tunable filters 20 and three ports 10 depicted although more ports 10 and tunable filters 20 can be analogously added. One tunable filter 20 is connected between port 1 and port 2, while the other tunable filter 20 is connected between port 1 and port 3. Each of the tunable filters 20 is formed of one or more unit cells 60 as discussed herein.

For the tunable filter 20 connected between port 1 and port 2, each unit cell 60 includes one or more DC-SQUIDs 705_2. In the unit cell 60, the capacitor C 50 connects/shunts the one or more DC-SQUIDs 705_2 to ground. When more than one DC-SQUID 705_2 is utilized in the unit cell 60, the DC-SQUIDs 705_2 are connected together in series. There can be a total of M DC-SQUIDs 705_2 per unit cell, where M is an integer of 1 or more. The tunable filter 20 between ports 1 and 2 includes one or more unit cells 60, such that each unit cells 60 is connected in series with ports 1 and 2, and the capacitor C 50 is connected to one end of the DC-SQUID 705_2 and to ground. There can be N number of unit cells 60 repeated and connected together in series in the tunable filter 20 for a total of N unit cells between ports 1 and 2, where N is an integer of 1 or more. For the tunable filter 20 between ports 1 and 2, the impedance of each unit cell is $Z_2$ where $$Z_2 = \sqrt{\frac{L_2}{C}}$$

and the angular frequency is $\omega_2$ where $$\omega_2 = \frac{1}{\sqrt{CL_2}}.$$

It is noted that each DC-SQUID 705_2 has an inductance and/or is an inductive element designated $L_2$.

For the tunable filter 20 connected between port 1 and port 3, each unit cell 60 includes one or more DC-SQUIDs 705_3. In the unit cell 60, the capacitor C 50 connects/shunts the one or more DC-SQUIDs 705_3 to ground. When more than one DC-SQUID 705_3 is utilized in the unit cell 60, the DC-SQUIDs 705_3 are connected together in series.

There can be a total of M DC-SQUIDs 705_3 per unit cell, where M is an integer of 1 or more. The tunable filter 20 between ports 1 and 3 includes one or more unit cells 60, such that each unit cell 60 is connected in series with ports 1 and 3, and the capacitor C 50 is connected to one end of the DC-SQUID 705_3 and to ground. There can be N number of unit cells 60 repeated and connected together in the tunable filter 20 for a total of N unit cells between ports 1 and 3, where N is an integer of 1 or more. For the tunable filter 20 between ports 1 and 3, the impedance of each unit cell is $Z_3$ where $$Z_3 = \sqrt{\frac{L_3}{C}}$$

and the angular frequency is $\omega_3$ where $$\omega_3 = \frac{1}{\sqrt{CL_3}}.$$

It is noted that each DC-SQUID 705_3 has an inductance and/or is an inductive element designated $L_3$.

Now, further information regarding DC-SQUIDs is provided below. A SQUID (Superconducting Quantum Interference Device) is a type of superconducting electronic device well-known to those skilled in the art. In particular, the type of SQUID known as a DC-SQUID includes a loop formed of superconducting wire, superconducting thin-film metal or other superconducting material, interrupted by two or more Josephson junctions (JJ) 710. The SQUID contains two or more Josephson junctions 710 in a current-carrying loop. As is widely understood by those skilled in the art, via the principle of quantum interference of superconducting currents, the combined Josephson critical current of the Josephson junctions within the SQUID will vary depending on the magnetic flux threading the SQUID loop. Likewise, the Josephson inductance exhibited by the SQUID's Josephson junctions will also vary depending on such magnetic flux (which is magnetic flux $\Phi_2$ for each DC-SQUID 705_2 and magnetic flux $\Phi_3$ for each DC-SQUID 705_3). Furthermore, arrays of SQUIDs can be arranged in an electrical circuit in such a way as to combine their inductances. It is specified that the magnetic flux of an in-plane loop represents a well-known and well-defined quantity including the magnetic field within the loop, multiplied by the cosine of the angle that the field makes with the axis perpendicular to the loop, integrated across the entire area of the loop. Thus, the SQUID is highly sensitive to both the magnitude and the direction of the magnetic field in its vicinity (for example, flux line 730_2 creates the magnetic field to thereby cause magnetic flux $\Phi_2$ for each DC-SQUID 705_2, while flux line 730_3 creates the magnetic field to thereby cause magnetic flux $\Phi_3$ for each DC-SQUID 705_3). The DC-SQUID 705_2 and 705_3 respectively experience the magnetic flux $\Phi_2$, magnetic flux $\Phi_3$ from the respective magnetic fields created by flux line 730_2, flux line 730_3 and thereby its Josephson inductance (the Josephson inductance is designated $L_{J2}$ for DC-SQUID 705_2 and $L_{J3}$ for DC-SQUID 705_3) is changed. To one skilled in the art, this sensitivity to magnetic field enables the SQUID to be employed as a useful component in an electric circuit, in that the variation of the SQUID's Josephson inductance causes useful changes in the circuit's properties. The inductance $L_2$ and $L_3$ of the DC-SQUIDs 705_2 and 705_3, respectively, corresponds to the Josephson inductance $L_{J2}$ for DC-SQUID 705_2 and $L_{J3}$ for DC-SQUID 705_3. To independently change/control (increase or decrease) the inductance $L_2$ and $L_3$ of the DC-SQUIDs 705_2 and 705_3, flux lines 730_2 and 730_3 are provided. The flux lines are can be generally referred to as flux lines 730. The flux lines 730_2 and 730_3 independently apply a magnetic 'bias' field perpendicular to the SQUID loop of the respective DC-SQUIDs 705_2 and 705_3, in order to set the 'working point' of the SQUID. The flux line 730_2 has current $I_2$ that creates a magnetic field to cause the magnetic bias flux $\Phi_2$ to change as desired. Similarly, the flux line 730_3 has current $I_3$ that creates a magnetic field to cause the magnetic bias flux $\Phi_3$ to change as desired. Accordingly, the tunable filters 20 between ports 1 and 2 and ports 1 and 3, respectively, are individually controlled such that one can be in transmission while the other is operating in reflection.

The inductance $L_2$ (per unit cell 60) for the tunable filter 20 between ports 1 and 2 can be defined as $L_2 \cong ML_{J2}+L_s$, where M is the number of DC-SQUIDS 705_2 in a unit cell, where $L_{J2}$ is the Josephson junction inductance of the DC-SQUID, and where $L_s$ is the series inductance of the transmission lines 30 (wires) of each unit cell. The inductance $L_2$ of each unit cell 60 is primarily based on the Josephson junction inductance $L_{J2}$. Therefore, Josephson junction inductance $L_{J2}$ is defined below (without the series inductance $L_s$ of the transmission line 30 (wires)): the Josephson junction inductance $$L_{J2} = \frac{L_{J0}}{\left|\cos\left(\pi\frac{\Phi_2}{\Phi_0}\right)\right|},$$

where $$L_{J0} = \frac{\Phi_0}{4\pi I_0},$$

where $I_0$ is the critical current of each Josephson junction 710, wherein $\Phi_2$ is the magnetic flux bias threading the loop, and where $\Phi_0=h/2e$ (superconducting magnetic flux quantum) in which h is Planck's constant and e is the electron charge.

Similarly, the inductance $L_3$ (per unit cell 60) for the tunable filter 20 between ports 1 and 3 can be defined as $L_3 \cong ML_{J3}+L_s$, where M is the number of DC-SQUIDS 705_3 in a unit cell, where $L_{J3}$ is the Josephson junction inductance, and where $L_s$ is the series inductance of the transmission line 30 (wires) of each unit cell. The inductance $L_3$ of each unit cell 60 is primarily based on the Josephson junction inductance $L_{J3}$. Therefore, Josephson junction inductance $L_{J3}$ is defined below (without the series inductance $L_s$ of the transmission line 30 (wires)): the Josephson junction inductance $$L_{J3} = \frac{L_{J0}}{\left|\cos\left(\pi\frac{\Phi_3}{\Phi_0}\right)\right|},$$

where $$L_{J0} = \frac{\Phi_0}{4\pi I_0},$$

where $I_0$ is the critical current of the (two) Josephson junctions 710, where $\Phi_3$ is the magnetic flux bias threading the loop, and where $\Phi_0=h/2e$ (superconducting magnetic flux quantum) in which h is Planck's constant and e is the electron charge. In this analysis, the experimenters assume that the DC-SQUIDs have small loops and that the self-inductance of the DC-SQUID loop is negligible compared to the Josephson inductance of the DC-SQUID.

It is noted that the inductance $L_2$ is the inductance of one unit cell 60 out of N unit cells (N≥1) connected in series with the transmission line in the tunable filter 20 between ports 1 and 2, and likewise the inductance $L_3$ is the inductance of one unit cell 60 out of N unit cells (N≥1) connected in series with the transmission line in the tunable filter 20 between ports 1 and 3.

It should be understood by one skilled in the art that the tunable filter design discussed herein is not limited to identical unit cells with respect to the inductive and capacitive elements in each unit cell. The identical unit cell picture is mainly presented here for simplicity and ease of understanding. In fact, varying the unit cells based on the microwave filter theory can be advantageous and yield a better performance in terms of the maximum amplitude of ripples in the filter response, the filter flatness, the filter bandwidth, the amount of reflection in-band and out-of-band, the amount of attenuation in the stopping band, etc. Accordingly, it should be appreciated that the unit cells may or may not be identical in one or more embodiments to employ any or more of the advantages discussed above.

As should be recognized, the superconducting microwave switch/router 100 can have one input port and N output ports in one configuration, and/or have one output port and N input ports in another configuration. All ports 10 of the device have the same characteristic impedance $Z_0$. Each input-output pair is connected through a tunable low-pass filter whose cut-off frequency can be tuned in-situ using applied magnetic flux. The tunable low-pass filter 20 can be implemented using a ladder of inductive elements (DC-SQUIDs) and capacitive elements (lumped-element capacitors).

By controlling the DC currents $I_2$ and $I_3$ respectively applied to the flux lines 730_2 and 730_3, one can independently set the magnetic bias fluxes $\Phi_2$ and $\Phi_3$ which determine inductance $L_2$ and $L_3$ in each chain. This in turn tunes the cutoff angular frequencies $\omega_{C2}$, $\omega_{C3}$ of the two tunable filters 20 relative to $\omega_0$ (of the microwave signal 305), such that one path (between ports 1 and 2) is in transmission while the other path (between ports 1 and 3) is in reflection, or vice versa.

To operate in reflection (i.e., block the microwave signal 305) for either tunable filter 20 (between ports 1 and 2 or between ports 3 and 4), one increases the DC currents $I_2$, $I_3$ to increase the magnetic bias flux $\Phi_2$, $\Phi_3$ (within 1 period of the cosine), which then increases the inductance $L_2$, $L_3$, thereby decreasing the cutoff angular frequency $\omega_{C2}$, $\omega_{C3}$. Conversely, to operate in transmission (i.e., pass the microwave signal 305) for either tunable filter 20 (between ports 1 and 2 or between ports 3 and 4), one decreases the DC currents $I_2$, $I_3$ to decrease the magnetic bias flux $\Phi_2$, $\Phi_3$ (within 1 period of the cosine), which then decreases the inductance $L_2$, $L_3$, thereby increasing the cutoff angular frequency $\omega_{C2}$, $\omega_{C3}$.

The DC-SQUIDs 705, capacitors 50 (with the exception of the dielectric material in the capacitors), flux lines 730, transmission lines 30, and Josephson junctions 710 are made of superconducting material. Again, examples of superconducting materials (at low temperatures, such as about 10-100 millikelvin (mK), or about 4 K) include niobium, aluminum, tantalum, etc. A Josephson junction is a nonlinear element formed of two superconducting metals sandwiching a thin insulator such as, for example, aluminum oxide, niobium oxide, etc.

Figure 8:
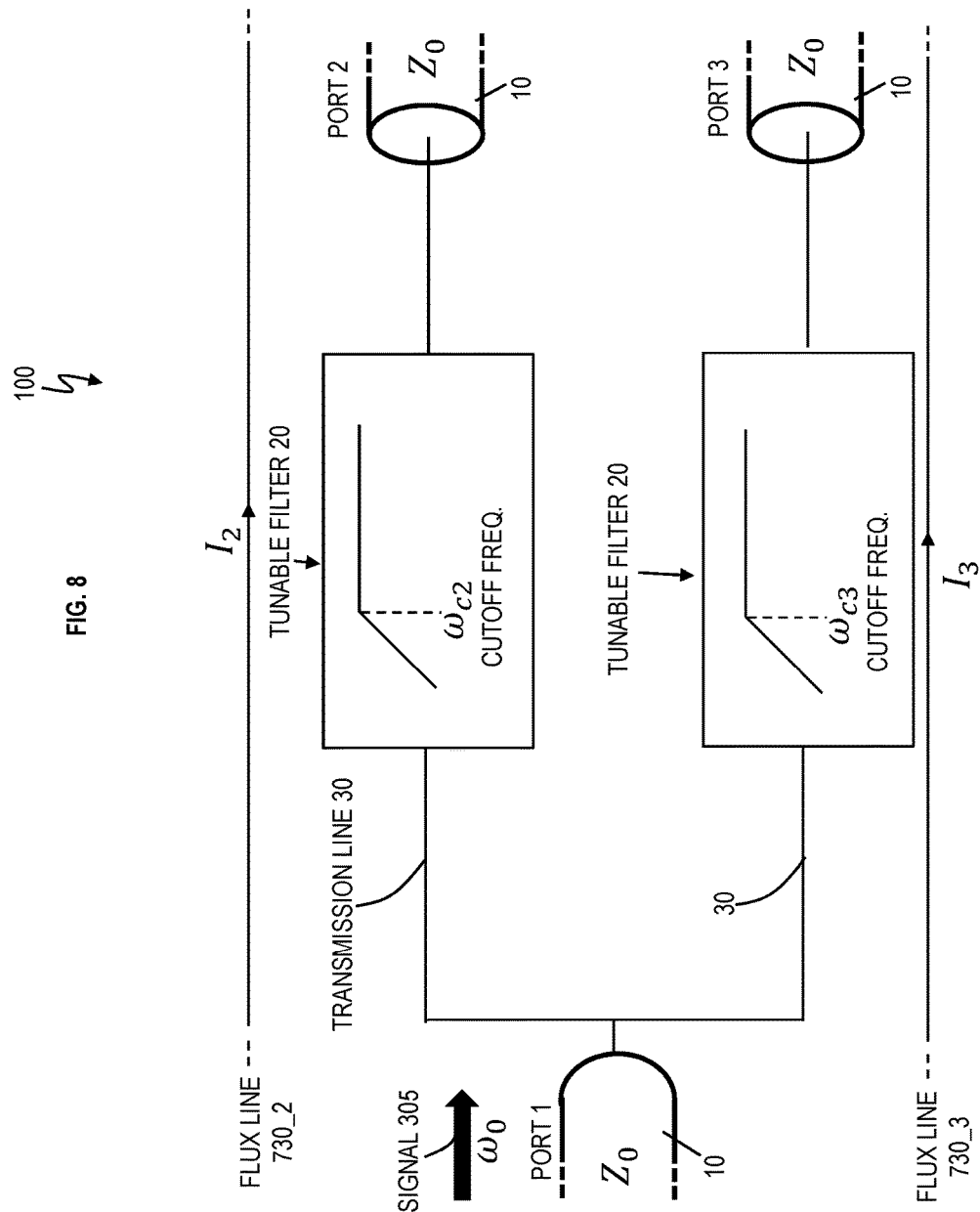
FIG. 8 is a schematic of a superconducting microwave switch/router according to one or more embodiments.

FIG. 8 is a schematic of a superconducting microwave switch/router 100 according to one or more embodiments. FIG. 8 is analogous to FIGS. 1-7, except for in this implementation, the tunable filters 20 are tunable high-pass filters. By having high-pass filters as the tunable filters 20, the inductive elements 40, 705 are interchanged with the capacitive elements 50. Accordingly, the capacitive elements 50 are in series between port 1 and 2 and between port 1 and 3, while the inductive elements 40, 705 (inductor or DC-SQUID) connects to one end of the capacitive element 50 and then connects to ground. For transmission from port 1 to port 2 (or vice versa), the following condition applies: $\omega_{c2} < \omega_0 \ll \omega_{c3}$. For transmission from port 1 to port 3 (vice versa), the following condition applies $\omega_{c3} < \omega_0 \ll \omega_{c2}$.

Figure 9:
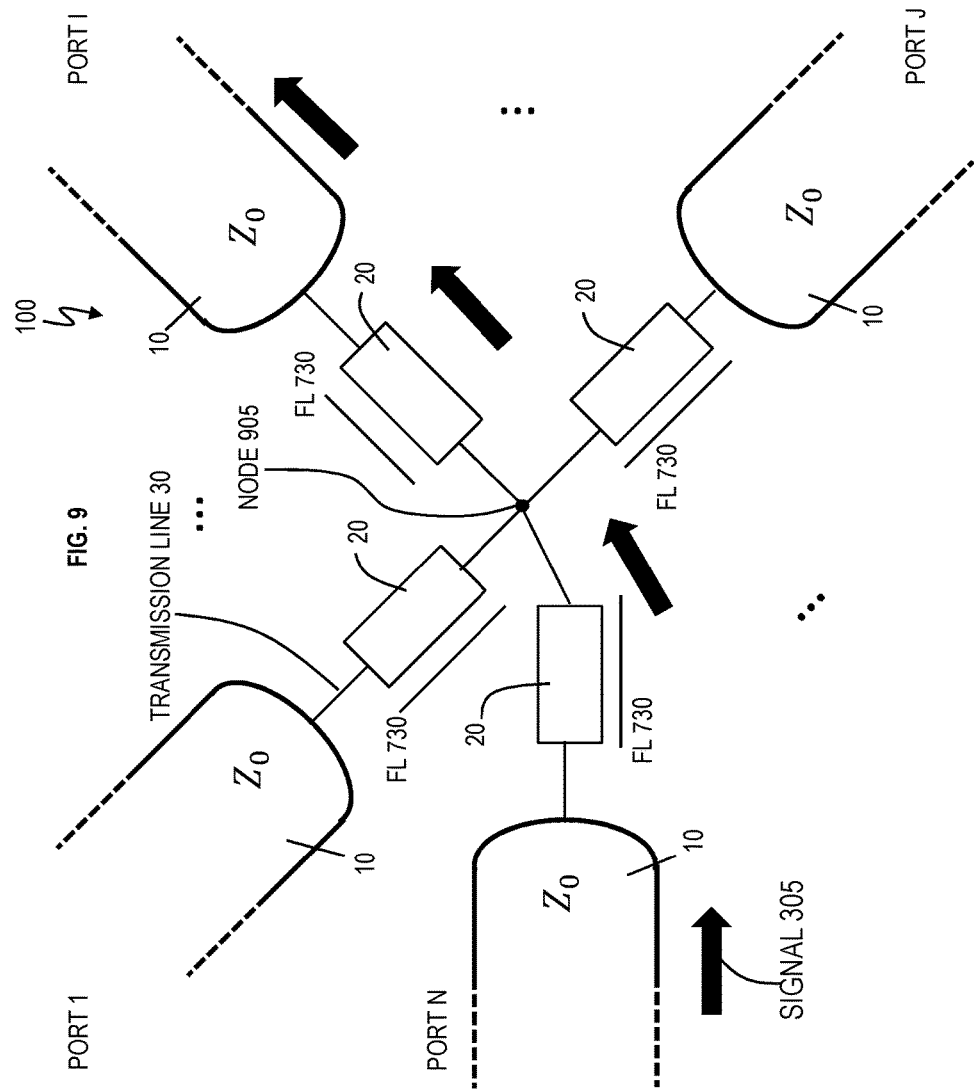
FIG. 9 is a schematic of a N port superconducting microwave switch/router according to one or more embodiments.

Now turning to FIG. 9, FIG. 9 is a schematic an N-port superconducting microwave router 100 according to one or more embodiments. The N-port superconducting microwave router 100 is generalized/designed such that there can be a connection made between any pair of ports 10 on the fly using current pulses to the relevant flux lines which in turn flux bias the relevant filters to their appropriate flux bias points. For example, at the moment (or nearly at the moment) the microwave signal 305 reaches a port 10, the connection can be made between any pair of ports 10 to transmit the microwave signal 305 while all other ports 10 (via their respective tunable filter 20) block the microwave signal 305. Accordingly, the microwave signal 305 can be routed between any pair of ports 10 according to the principles discussed herein.

The N-port superconducting microwave router 100 includes port 1, port I, port J, through port N. Each of the port 1-N has its own tunable low-pass filter 20, such that an individual port 10 connects to a tunable filter 20 that connects to a node 905. The features extensively described above in FIGS. 1-8 apply to FIG. 9 and are not repeated for the sake of brevity and to avoid obscuring FIG. 9. All of the ports 1-N are symmetrical and are on the same footing (which is different from the previously described superconducting microwave switches/router 100 above). Being on the same footing means that the node 905 is a central connection that connects all of the ports 1-N, that each port 10 has its own tunable filter 20, and that each tunable filter 20 has its own flux line (FL) for tuning its cutoff frequency.

As one example, to route the microwave signal 305 from port N to port I, both tunable filters 20 between port N and node 905 and between port I and node 905 have to be tuned to be in transmission; concurrently, all remaining tunable filters 20 are tuned to be in reflection. This allows the microwave signal 305 to be transmitted from port N to its tunable filter 20, to the node 905, to tunable filter 20 connected to port I, and then transmitted to port I.

Regarding the node 905, a few technical details are discussed. In general, node 905 is to be as small as possible and ideally lumped with respect to the wavelengths used in the device operation for two reasons: 1) minimize reflections, which can limit the transmission of the routed signal, and 2) enable connecting multiple transmission lines to the node 905. Furthermore, the ability to connect multiple transmission lines to a common node 905 can require using high impedance (very narrow) wires, which might in turn require designing the tunable filters to have a characteristic impedance which matches the impedance of the connecting lines when the filters are operating in transmission (in order to minimize reflections) in one implementation. Lastly, if the characteristic impedance of the tunable filters is different from the characteristic impedance of the device ports, certain matching networks can be designed and integrated between the filters and the device (in order to allow smooth transmission for the propagating signals).

Figure 10:
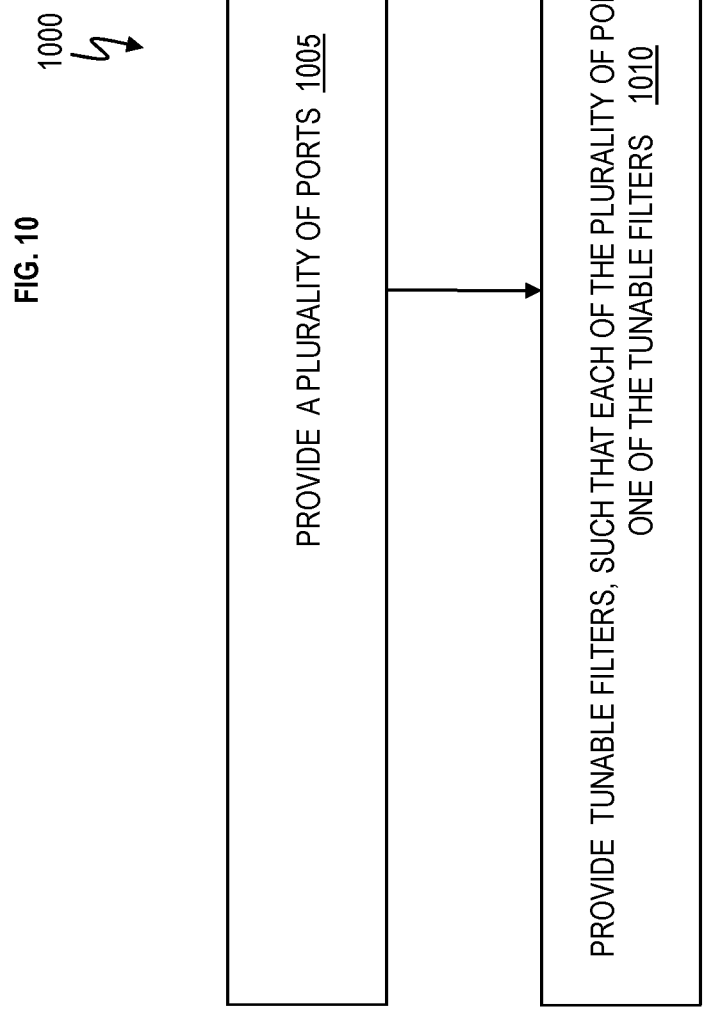
FIG. 10 is a flow chart of a method of configuring a superconducting microwave switch/router according to one or more embodiments.

FIG. 10 is a flow chart 1000 of a method of configuring a lossless/superconducting microwave switch/router 100 according to one or more embodiments. Reference can be made to FIGS. 1-9 discussed herein.

At bock 1005, a plurality of ports 10 are provided. At block 1010, tunable filters 20 are provided and connected to the ports 10, such that each of the plurality of ports 10 has a corresponding one of the tunable filters 20.

The tunable filters 20 connect to a node 905 (a conductive connection point). A plurality of flux lines (FL) 730 are provided, such that an individual one of the plurality of flux lines 730 tunes an individual one of the tunable filters 20 on a one-to-one basis. A plurality of magnetic sources (such as flux lines, current carrying wires, tunable magnets, etc.) are provided, such that an individual one of the plurality of magnetic sources tunes an individual one of the tunable filters 20 on a one-to-one basis. It should be noted that this picture of one flux line controlling one tunable filter can be simplistic. This is because the DC-SQUID's response/inductance is determined by the total flux threading its loop, and therefore any change in the current of other flux lines can alter, in principle, the flux bias experienced by the DC-SQUID. Of course, the induced flux by the other flux lines drops considerably with the distance between them and the DC-SQUID, thus by keeping them sufficiently apart the experimenters can significantly reduce their contribution. Nevertheless, there can be one or more scenarios that in order to tune the flux bias of one filter, one might apply multiple changes to the currents flowing in nearby flux lines such that the currents yield the desired flux bias in the various controlled filters.

The tunable filters 20 include superconducting material. Example superconducting materials at superconducting temperatures (e.g., 10-100 millikelvin (mK), or 4 K) can include niobium, aluminum, tantalum, etc.

The tunable filters 20 can be tunable lossless low-pass filters. Any one of the plurality of ports 10 (e.g., port 1) is configured to transmit a microwave signal 305 to any other one of the plurality of ports 10 (port 2). The corresponding one of the tunable filters 20 for the any one of the plurality of ports 10 and the corresponding one of the tunable filters 20 for the any other one of the plurality of ports 10 are both configured to be tuned to transmit (i.e., in transmission) the signal 305 while all other ones of the tunable filters 20 are configured to be tuned to block the signal. Each of the lossless low-pass filters includes one or more DC SQUIDS in series with a center conductor of a transmission line and shunted by a capacitor to ground. It should be appreciated that a transmission line, such as a coaxial cable, has a center conductor and an outer conductor.

FIG. 11 is a flow chart 1100 of a method for configuring a lossless/superconducting microwave switch/router 100 according to one or more embodiments. Reference can be made to FIGS. 1-9 discussed herein.

At block 1105, a plurality of ports 10 are provided. At block 1110, tunable filters 20 are connected to the plurality of ports 10, where each of the plurality of ports 10 is associated with one of the tunable filters 20, where each of the tunable filters 20 includes a superconducting quantum interference device 705. The tunable filters 20 can be low-pass filters. The tunable filters 20 can be high-pass filters.

FIG. 12 is a flow chart 1200 of a method of configuring a lossless/superconducting microwave switch/router 100 according to one or more embodiments. Reference can be made to FIGS. 1-9 discussed herein.

At block 1205, a node 905 is provided a central connection point. At block 1210, tunable filters 20 are connected to the node 905, where the tunable filters 20 are configured to be independently tuned to a first state (i.e., mode of operation for transmission) to transmit a microwave signal 305 and be independently tuned to a second state (i.e., mode of operation for reflection) to block the microwave signal 305, such that any one of the tunable filters 305 is configured to transmit the signal to any other one of the tunable filters 20 via the node 905.

Any one of the tunable filters 20 and the any other one of the tunable filters 20 are both configured to be in the first state, while all remaining tunable filters 20 are configured to be in the second state, thereby allowing the microwave signal 305 to be transmitted from the any one of the tunable filters 20 to the any other one of the tunable filters 20 via the node 905.

FIG. 13 is a flow chart 1300 of a method of configuring a lossless/superconducting microwave switch/router 100 according to one or more embodiments. Reference can be made to FIGS. 1-9 discussed herein.

At block 1305, a plurality of ports 10 are provided. At block 1310, a first pair of the plurality of ports 10 has at least one tunable filter 20 connected in between, in which the tunable filter 20 is configured to transmit a microwave signal 305. At block 1315, a second pair of the plurality of ports 10 has another tunable filter 20 connected in between, in which the another tunable filter 20 is configured to reflect the microwave signal.

Technical effects and benefits include a lossless/superconducting microwave switch/router. Technical benefits further include low attenuation of transmitted signals <0.05 dB (decibels), fast switching (no resonators) such as in nanoseconds (depending on the mutual inductance between the flux lines and the SQUIDs), and relatively large bandwidth (bw) >280 megahertz (MHz) (which can be significantly enhanced by allowing certain variation in the unit cells). Also, technical benefits further include relatively large on/off ratio >20 dB. The lossless/superconducting microwave switch/router can tolerate relatively large powers >−80 dBm (where 0 dBm corresponds to 1 milliwatt) by adding more SQUIDs and increasing their critical current. The lossless/superconducting microwave switch/router can be fabricated with Nb Josephson junctions to operate at 4K, can be designed for any frequency range, and provides a scalable scheme that can be easily extended to 1 input-N outputs (or vice versa).

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A lossless microwave switch comprising:
a plurality of ports;
a first pair of the plurality of ports having a tunable filter connected in between, the tunable filter being configured to transmit a microwave signal; and
a second pair of the plurality of ports having another tunable filter connected in between, the another tunable filter being configured to reflect the microwave signal, wherein the tunable filter and the another tunable filter each connect to one node.

2. The lossless microwave switch of claim 1, further comprising a plurality of flux lines.

3. The lossless microwave switch of claim 2, wherein an individual one of the plurality of flux lines tunes an individual one of the tunable filter and the another tunable filter on a one-to-one basis.

4. The lossless microwave switch of claim 2, wherein one or more flux lines of the plurality of flux lines contributes to tuning an individual one of the tunable filter and the another tunable filter.

5. The lossless microwave switch of claim 1, further comprising a plurality of magnetic sources, such that an individual one of the plurality of magnetic sources tunes an individual one of the tunable filter and the another tunable filter on a one-to-one basis.

6. The lossless microwave switch of claim 1, wherein the tunable filter and the another tunable filter comprise superconducting material.

7. The lossless microwave switch of claim 1, wherein the tunable filter and the another tunable filter are lossless high-pass filters.

8. The lossless microwave switch of claim 7, wherein each of the lossless high-pass filters include a capacitor shunted by one or more DC SQUIDS.

9. The lossless microwave switch of claim 1, wherein transmission lines connect the plurality of ports, the tunable filter, and the another tunable filter.

10. The lossless microwave switch of claim 9, wherein the transmission lines include superconducting material.

11. The lossless microwave switch of claim 1, wherein the tunable filter includes unit cells, the unit cells including superconducting material.

12. The lossless microwave switch of claim 11, wherein the unit cells are a same.

13. The lossless microwave switch of claim 11, wherein the unit cells are different.

14. The lossless microwave switch of claim 1, wherein the another tunable filter includes unit cells, the unit cells including superconducting material.

15. The lossless microwave switch of claim 14, wherein the unit cells are the same.

16. The lossless microwave switch of claim 14, wherein the unit cells are different.

17. A lossless microwave switch comprising:
a plurality of ports;
a first pair of the plurality of ports having a tunable filter connected in between, the tunable filter being configured to transmit a microwave signal; and
a second pair of the plurality of ports having another tunable filter connected in between, the another tunable filter being configured to reflect the microwave signal, wherein the tunable filter and the another tunable filter are lossless low-pass filters.

18. The lossless microwave switch of claim 17, wherein the each of the lossless low-pass filters includes one or more DC SQUIDS in series with a center conductor of a transmission line and shunted by a capacitor to ground.

19. A lossless microwave switch comprising:
a plurality of ports;
a first pair of the plurality of ports having a tunable filter connected in between, the tunable filter being configured to transmit a microwave signal; and
a second pair of the plurality of ports having another tunable filter connected in between, the another tunable filter being configured to reflect the microwave signal, wherein any one of the plurality of ports is configured to transmit a signal to any other one of the plurality of ports.

* * * * *